US012588445B2

(12) United States Patent
Lysacek et al.

(10) Patent No.: US 12,588,445 B2
(45) Date of Patent: Mar. 24, 2026

(54) METHODS OF MANUFACTURING SEMICONDUCTOR DEVICES AND SEMICONDUCTOR DEVICES

(71) Applicant: SEMICONDUCTOR COMPONENTS INDUSTRIES, LLC, Phoenix, AZ (US)

(72) Inventors: David Lysacek, Zasova (CZ); Jan Hybl, Zubri (CZ); Dusan Postulka, Ostrava (CZ); Juraj Jarina, Rajec (SK); Vit Janirek, Roznov pod Radhostem (CZ); Alexandra Senkova, Vetrkovice u Vitkova (CZ)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 689 days.

(21) Appl. No.: 17/822,008

(22) Filed: Aug. 24, 2022

(65) Prior Publication Data

US 2024/0071775 A1     Feb. 29, 2024

(51) Int. Cl.
*H01L 21/322* (2006.01)
*C30B 15/18* (2006.01)
(Continued)

(52) U.S. Cl.
CPC .......... *H01L 21/3225* (2013.01); *C30B 15/18* (2013.01); *H01L 21/304* (2013.01); *H01L 21/30604* (2013.01)

(58) Field of Classification Search
CPC .............. H01L 21/3225; H01L 21/304; H01L 21/30604; H01L 21/324; H01L 21/67248;
(Continued)

(56) References Cited

U.S. PATENT DOCUMENTS 5,448,083 A * 9/1995 Kitagawa ............. H10D 12/421
257/E29.199
6,413,310 B1 * 7/2002 Tamatsuka .............. C30B 29/06
257/E21.321
(Continued)

FOREIGN PATENT DOCUMENTS

EP          181065 A1    5/1986
EP         1035235 A1    9/2000
(Continued)

OTHER PUBLICATIONS

JO2001-151596A (Year: 2001).*
(Continued)

*Primary Examiner* — Dale E Page
*Assistant Examiner* — Quovaunda Jefferson
(74) *Attorney, Agent, or Firm* — Kevin B. Jackson

(57) ABSTRACT

In an example, a method of manufacturing a semiconductor device includes providing a semiconductor substrate comprising an unpolished CZ silicon substrate, a substrate upper side, and a substrate lower side opposite to the substrate upper side. The method includes first annealing the semiconductor substrate at a first temperature in an inert environment for a first time. The method includes second annealing the semiconductor substrate at a second temperature in a wet oxidation environment for a second time. The first annealing dissolves inner wall oxide in bulk region voids and the second annealing fills the voids with semiconductor interstitials. In some examples, the CZ silicon substrate is provided from a CZ ingot grown in the presence of a magnetic field and using continuous counter-doping. The method provides, among other things, a CZ silicon substrate with reduced crystal originated particle (COP) defects, reduced oxygen concentration, and reduced radial resistivity variation.

18 Claims, 8 Drawing Sheets

(51) Int. Cl.
    *H01L 21/304*       (2006.01)
    *H01L 21/306*       (2006.01)

(58) Field of Classification Search
    CPC ... H01L 21/67253; C30B 15/04; C30B 15/18;
          C30B 15/305; C30B 33/005; C30B 33/02;
            C30B 33/10; C30B 29/06; C30B 30/04;
              H10D 12/481; H10D 12/491; H10D
              12/038; H10D 30/668; H10D 62/53
    See application file for complete search history.

(56) References Cited

U.S. PATENT DOCUMENTS

| | | | | |
|---|---|---|---|---|
| 9,666,523 | B2 * | 5/2017 | Wood | .................. H01L 23/5227 |
| 2003/0221609 | A1 | 12/2003 | Falster | |
| 2007/0000427 | A1 | 1/2007 | Umeno et al. | |
| 2007/0193501 | A1 | 8/2007 | Ono et al. | |
| 2012/0301386 | A1 * | 11/2012 | Johnson | .................. C30B 15/12 |
| | | | | 117/214 |

FOREIGN PATENT DOCUMENTS

| | | | |
|---|---|---|---|
| JP | 2001151596 | A | 6/2001 |
| JP | 2006344823 | A | 12/2006 |
| JP | 2007254274 | A | 10/2007 |
| JP | 2010062466 | A | 3/2010 |
| JP | WO2009025336 | A1 | 11/2010 |
| JP | 5304649 | B2 | 10/2013 |
| KR | 20070077073 | A | 7/2007 |
| KR | 20140097971 | A | 8/2014 |
| KR | 20170046135 | A | 4/2017 |

OTHER PUBLICATIONS

European Search Report for counterpart application No. 23184782.
3, mailed Jan. 1, 2024, 13 pages.
Pam-Xiamen, Xiamen Powerway Advanced Material Co., Ltd.,
"COP Free Silicon Wafer at Prime Grade Grown by CZ Technique,"
Jun. 23, 2022.
Hans-Joachim Schulze et al., "Fabrication of IGBTs using 300 mm
magnetic Czochralski substrated," IET Power Electronics, Sep. 19,
2019.

* cited by examiner

B100

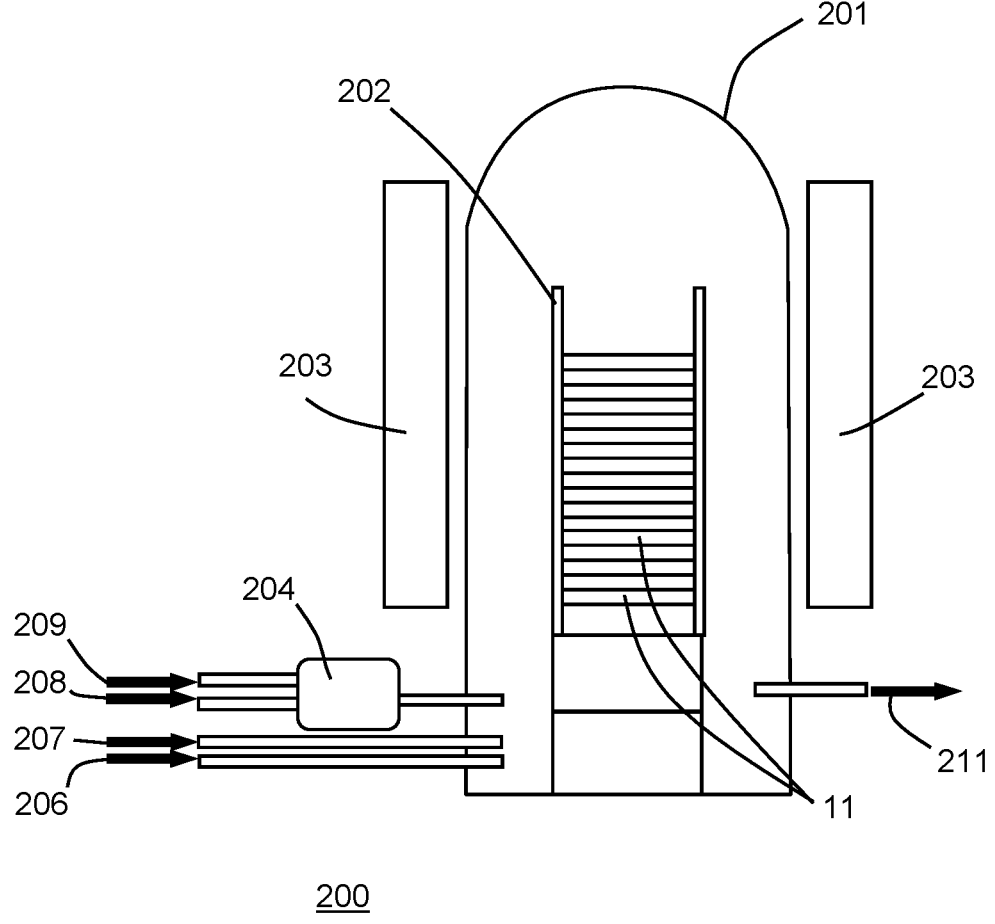
_FIG. 5_

11

11

21

11A

22

13A

13A

11B

11

11AB

22T

22

13A

13A

11B

11

Substrate COP Size Distribution Data

(with process of FIG. 1)

Void Distribution on Substrate With Process (Microns)

Substrate COP Size Distribution Data

(without process of FIG. 1)

Void Distribution on Substrate Without Process (Microns)

METHODS OF MANUFACTURING SEMICONDUCTOR DEVICES AND SEMICONDUCTOR DEVICES

CROSS-REFERENCE TO RELATED APPLICATIONS

Not applicable.

TECHNICAL FIELD

The present disclosure relates, in general, to electronics and, more particularly, to methods of forming semiconductor devices and semiconductor device structures.

BACKGROUND

The manufacturing of many semiconductor devices takes place on silicon substrates or wafers having a very high crystalline perfection. Starting substrates require a degree of chemical purity, a degree of crystal perfection, uniformity of structure, and appropriate chemical composition. Imperfections in the semiconductor crystal structures can significantly impact the properties of the crystal and therefore the performance of semiconductor devices manufactured on the substrates. Also, non-uniformity of structure and chemical composition can impact manufacturing yields and electrical performance.

In the manufacture of silicon substrates, electronic grade polysilicon is used to grow single crystal silicon by Czochralski (CZ) crystal growth or float zone (FZ) crystal growth. In CZ crystal growth, single crystal ingots are pulled from molten silicon contained within a crucible. In FZ crystal growth, a floating zone of melt (that is, a molten zone) is formed between a single crystal seed and a polycrystalline rod by, for example, RF heating. The zone is moved along the length of the rotating polycrystalline rod to produce a single crystal ingot of approximately the same dimensions as the polycrystalline rod. A crucible is not used in the FZ process, so the silicon does not come into contact with any substance other than ambient gas in growth chamber. Thus, FZ crystals have higher inherent purity than CZ crystals. In addition, FZ substrates can be manufactured with narrower dopant or resistivity profiles, lower oxygen content, and with lower occurrences of crystal originated particles (COPs) compared to typical CZ substrates.

Some power semiconductor devices require high purity silicon substrates and thus FZ silicon substrates are often the material of choice. However, FZ substrates are more expensive to manufacture than CZ substrates and FZ substrates are not available at larger diameters, such as 300 millimeters (mm). CZ substrates are available in larger diameters including 300 mm substrates.

Accordingly, methods and structures are needed that provide CZ substrates with higher resistivity, narrow resistivity profiles, lower oxygen content, reduced occurrences of COP defects, and that support power semiconductor manufacturing using 200 mm, 300 mm, and greater substrate diameters.

BRIEF DESCRIPTION OF THE DRAWINGS

FIG. 5 illustrates a cross-sectional view of an example apparatus used in the process flow of FIG. 1;

Figure 1:
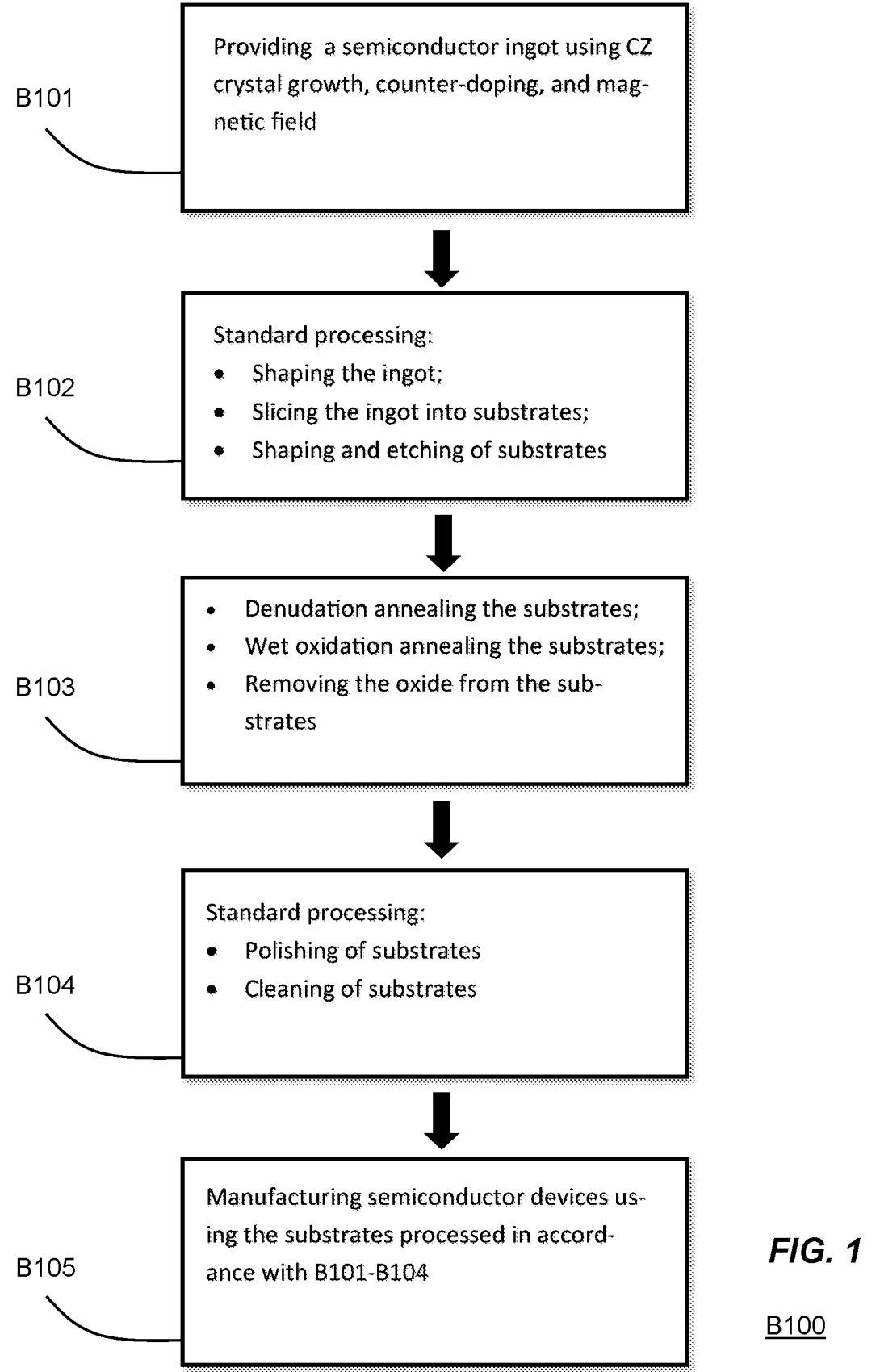
FIG. 1 illustrates a block diagram of a process flow in accordance with the present description.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

For simplicity and clarity of the illustration, elements in the figures are not necessarily drawn to scale, and the same reference numbers in different figures denote the same elements. Additionally, descriptions and details of well-known steps and elements are omitted for simplicity of the description.

For clarity of the drawings, certain regions of device structures, such as doped regions or dielectric regions, may be illustrated as having generally straight-line edges and precise angular corners. However, those skilled in the art understand that, due to the diffusion and activation of dopants or formation of layers, the edges of such regions generally may not be straight lines and that the corners may not be precise angles.

Although the semiconductor devices are explained herein as certain N-type conductivity regions and certain P-type conductivity regions, a person of ordinary skill in the art understands that the conductivity types can be reversed and are also possible in accordance with the present description, taking into account any necessary polarity reversal of voltages, inversion of transistor type and/or current direction, etc.

In addition, the terminology used herein is for the purpose of describing particular examples only and is not intended to be limiting of the disclosure. As used herein, the singular forms are intended to include the plural forms as well, unless the context clearly indicates otherwise.

As used herein, "current-carrying electrode" means an element of a device that carries current through the device, such as a source or a drain of an MOS transistor, an emitter or a collector of a bipolar transistor, or a cathode or anode of a diode, and a "control electrode" means an element of the device that controls current through the device, such as a gate of a MOS transistor or a base of a bipolar transistor.

The term "major surface" when used in conjunction with a semiconductor region, wafer, or substrate means the surface of the semiconductor region, wafer, or substrate that forms an interface with another material, such as a dielectric, an insulator, a conductor, or a polycrystalline semiconductor. The major surface can have a topography that changes in the x, y and z directions.

The terms "comprises", "comprising", "includes", "including", "has", "have" and/or "having" when used in this description, are open ended terms that specify the presence of stated features, numbers, steps, operations, elements, and/or components, but do not preclude the presence or addition of one or more other features, numbers, steps, operations, elements, components, and/or groups thereof.

The term "or" means any one or more of the items in the list joined by "or". As an example, "x or y" means any element of the three-element set $\{(x), (y), (x, y)\}$. As another example, "x, y, or z" means any element of the seven-element set $\{(x), (y), (z), (x, y), (x, z), (y, z), (x, y, z)\}$.

Although the terms "first", "second", etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure.

It will be appreciated by one skilled in the art that words, "during", "while", and "when" as used herein related to circuit operation are not exact terms that mean an action takes place instantly upon an initiating action but that there may be some small but reasonable delay, such as propagation delay, between the reaction that is initiated by the initial action. Additionally, the term "while" means a certain action occurs at least within some portion of a duration of the initiating action.

The use of word "about", "approximately", or "substantially" means a value of an element is expected to be close to a state value or position. However, as is well known in the art there are always minor variances preventing values or positions from being exactly stated.

Unless specified otherwise, as used herein, the word "over" or "on" includes orientations, placements, or relations where the specified elements can be in direct or indirect physical contact.

Unless specified otherwise, as used herein, the word "overlapping" includes orientations, placements, or relations where the specified elements can at least partly or wholly coincide or align in the same or different planes.

It is further understood that the examples illustrated and described hereinafter suitably may have examples and/or may be practiced in the absence of any element that is not specifically disclosed herein.

DESCRIPTION

In general, the present examples relate to semiconductor device structures and methods of making semiconductor devices that use CZ semiconductor substrates, such as CZ silicon substrates. More particularly, a method is described that provides CZ semiconductor substrates that comprises characteristics similar to FZ semiconductor substrates. This includes, for example, low oxygen concentration and improved radial resistivity variation. Also, the method provides semiconductor substrates having larger diameters (≥200 mm) than are available for FZ semiconductor substrates. In addition, the method provides significantly reduced COP defect concentration compared to previous CZ semiconductor substrates Among other things, the method provides CZ semiconductor substrates that can be used to manufacture higher voltage power semiconductor devices at a lower cost compared to FZ semiconductor substrates.

In an example, a method of manufacturing a semiconductor device includes providing a semiconductor substrate comprising an unpolished CZ silicon substrate, a substrate upper side, and a substrate lower side opposite to the substrate upper side. The method includes first annealing the semiconductor substrate at a first temperature in an inert environment for a first time. The method includes second annealing the semiconductor substrate at a second temperature in a wet oxidation environment for a second time.

In an example, a method of forming a semiconductor device comprises providing a CZ semiconductor substrate comprising an oxygen concentration less than about 26 parts per million atoms (ppma), a radial resistivity variation less than 3.5%; and a substrate upper side. The method includes first annealing the CZ semiconductor substrate at a first temperature in an inert environment for a first time. The method includes second annealing the CZ semiconductor substrate at a second temperature in a thermal oxidation environment for a second time.

In an example, a semiconductor device comprises a body of semiconductor material comprising a CZ silicon material, an oxygen concentration less than about 26 parts per million atoms (ppma), a first conductivity type, an upper side, a lower side opposite to the upper side, and a region extending inward from the upper side comprising a crystal originated particle (COP) surface concentration less than about 1 defect/cm$^2$ for COP defects greater than 0.06 microns in size. A first doped region of a second conductivity type is in the region proximate to the upper side. An insulated gate electrode is proximate to the upper side. A second doped region of the first conductivity type is in the first doped region proximate to the insulated gate electrode.

Other examples are included in the present disclosure. Such examples may be found in the figures, in the claims, or in the description of the present disclosure.

FIG. 1 illustrates a block diagram of a process flow B100 in accordance with the present description for providing semiconductor substrates 11 (illustrated in FIGS. 5-9). Semiconductor substrates 11 also can be referred to as wafers, substrates, or work pieces. In some examples, process flow B100 comprises blocks B101 to B105 and the individual blocks can contain one or more unit process(es). In the description of process flow B100, specific reference will be made to FIGS. 2-12.

Figure 2:
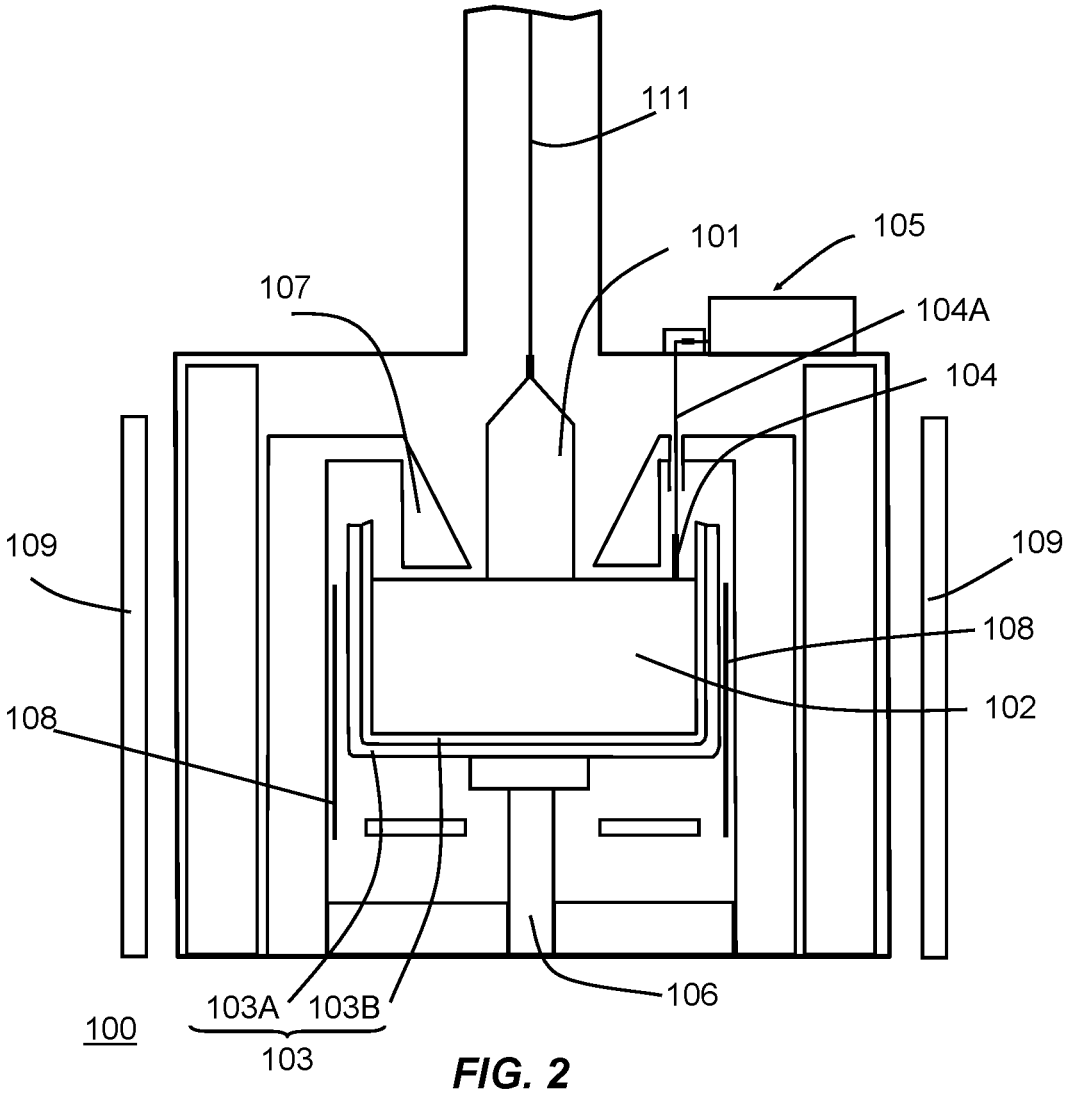
FIG. 2 illustrates a cross-sectional view of an example apparatus used in the process flow of FIG. 1.

Block B101 describes providing a semiconductor ingot using Czochralski (CZ) crystal growth with counter-doping and in the presence of a magnetic field. FIG. 2 illustrates a simplified cross-sectional view of an example apparatus 100, which may also be referred to as a CZ crystal growth apparatus, for use with block B101 in accordance with the present description. In some examples, apparatus 100 is used to grow CZ semiconductor ingot 101, which may also be referred to as an ingot, a silicon ingot, a semiconductor ingot, or a crystal body. In some examples, apparatus 100 comprises a melt or semiconductor material source 102 within a crucible 103. In some examples, crucible 103 comprises a graphite crucible portion 103A as an outer portion of crucible 103, and a silicon crucible portion 103B as an inner portion of crucible 103. Apparatus 100 further includes a heater 108 such as a graphite heater, which is configured to heat crucible 103 to a predetermined temperature to provide melt 102 in a heated liquid form within crucible 103. A heat shield 107 is configured as a containment apparatus for heater 108 and crucible 103.

In accordance with the present description, apparatus 100 comprises a counter-doping source 104 within melt 102 to reduce axial resistivity variation of CZ semiconductor ingot 101. More particularly, when CZ semiconductor ingot 101 comprises a first conductivity type (for example, N-type conductivity) then counter-doping source 104 comprises a second conductivity type which is opposite to the first conductivity type (for example, P-type conductivity). In some examples, counter-doping source 104 comprises a silicon rod with a second conductivity type dopant (for example, boron when CZ semiconductor ingot 101 is N-type conductivity). In accordance with the present description, counter-doping is achieved by continuously melting the boron doped silicon rod within melt 102 during the growth of CZ semiconductor ingot 101.

In some examples, counter-doping source 104 is attached to a graphite cable 104A, which can be coupled to a controller 105 configured to control the placement (for example, the speed of dipping) within melt 102 during the growth of CZ semiconductor ingot 101. In some examples, controller 105 is configured to provide counter-doping source 104 so that it is continuously dipped into melt 102 during the growth of CZ semiconductor ingot 101. In some examples, the speed of dipping is determined by the pulled weight of CZ semiconductor ingot 101 and is a function of the initial dopant concentration in melt 102 and the segregation coefficients of both the N-type conductivity dopant and the P-type conductivity dopant. It was found in practice that counter-doping source 104 used as described herein provided an axial resistivity variation below+/−5% over greater than 60% of length of CZ semiconductor ingot 101 with a resistivity range from about 1.0 ohm-cm to about 110 ohm cm for an N-type conductivity silicon CZ semiconductor ingot.

Apparatus 100 further includes a magnet 109 configured to provide a magnetic field within apparatus 100. In some examples, magnet 109 is a water-cooled cusp magnet and is configured to reduce oxygen concentration and radial resistivity variation within CZ semiconductor ingot 101. In some examples, magnet 109 provides a magnetic field for CZ semiconductor ingot 101 in a range from greater than about 0 Gauss to about 1000 Gauss. In some examples, CZ semiconductor ingot 101 is grown under an argon atmosphere within apparatus 100.

Figure 3:
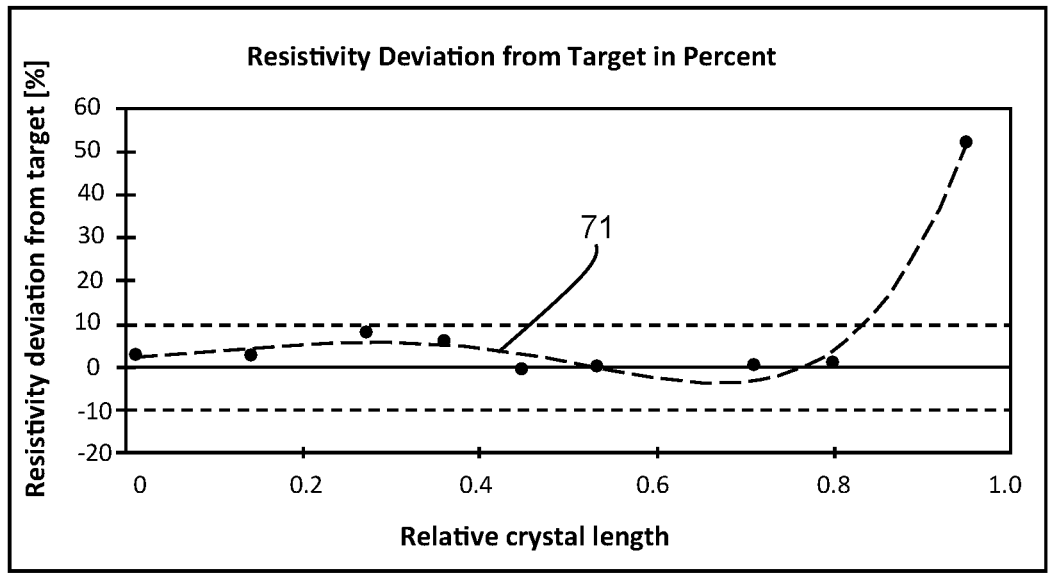
FIG. 3 graphically illustrates resistivity deviation from target as a function of relative crystal ingot length in accordance with an example ingot processed in accordance with the present description.
Figure 4:
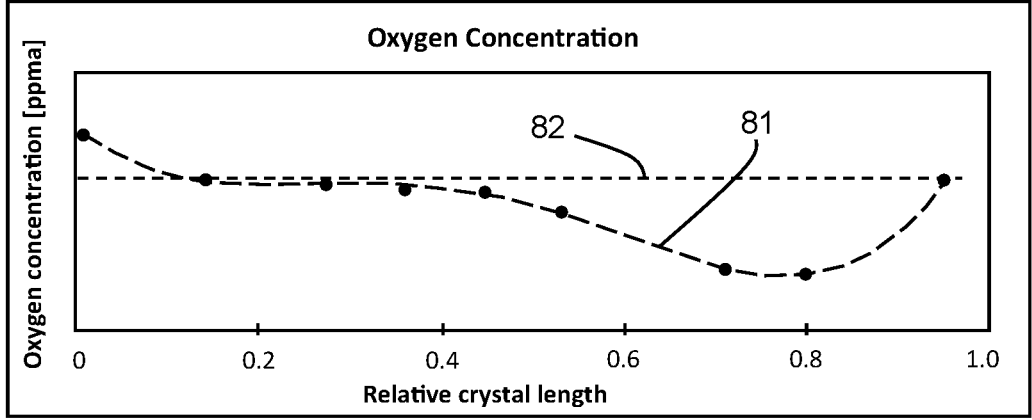
FIG. 4 graphically illustrates oxygen concentration as a function of relative crystal ingot length in accordance with an example ingot processed in accordance with the present description.

FIG. 3 graphically illustrates axial resistivity deviation from target as represented by data curve 71 as a function of relative crystal ingot length, and FIG. 4 graphically illustrates axial oxygen concentration represented by data curve 81 as a function of relative crystal ingot length in accordance with an example CZ semiconductor ingot 101 processed in accordance with block B101 of the present description. As illustrated in FIG. 3, CZ semiconductor ingot 101 had an axial resistive deviation from target of less than 10% from target for approximately 80% of its length, which is very good crystal utilization. In comparison, it was found in practice that without counter-doping, the crystal utilization was about 15%. As illustrated in FIG. 4, CZ semiconductor ingot 101, which was grown in the presence of the magnetic field provided by magnet 109, had an oxygen concentration less than of less than 20.5 parts per million atoms (ppma) (represented by upper limit 82) for over 80% of its length. This is less than an accepted industry standard of 26 ppma. In addition, it was found in practice that CZ semiconductor ingot 101 had a radial resistivity variation of less than 3.5%. In accordance with the present description, CZ semiconductor ingot 101 is provided without using nitrogen doping or neutron irradiation. In addition, CZ semiconductor ingot 101 is grown using a standard crucible, which saves on manufacturing costs.

Block B102 of process flow B100 describes steps to further process CZ semiconductor ingot 101 provided using block B101. In some examples, standard ingot processing is used to shape CZ semiconductor ingot 101 and to separate (for example, slice or saw) shaped CZ semiconductor ingot 101 into individual wafers or substrates including semiconductor substrates 11. In some examples, the ends of CZ semiconductor ingot 101 are removed, and the remaining ingot can be subjected to a grinding operation that removes excess material to provide a cylindrical shape of more precise diameter. The grinding operation can be followed by an etch step that removes any grinding work damage. For larger diameter substrates (for example, ≥200 mm in diameter) a notch can be provided in the ingot for alignment in subsequent processing and to identify crystal orientation. Next, the ingot is separated into the individual substrates using, for example, an inner diameter (ID) sawing apparatus or an apparatus comprising slurry-coated wires.

Block B102 also describes a step of shaping of the substrates. In some examples, after the sawing process, portions of the as-sawn substrates can be removed using lapping and grinding processes to reduce thickness variability. In some examples, the edges of the substrates can be shaped or rounded, which can reduce the incidence of chipping and reduce film build-up at the edges of the substrates during normal substrate handling and processing. In some examples, the substrates are etched to remove work damage and contamination caused by the substrate shaping processes. When the substrates comprise silicon, wet etchants utilizing an etchant solution of hydrofluoric, nitric, and acetic acids can be used. At this point in the process after block B102 and before block B103, the substrates are not yet polished.

In some examples, blocks B101 and B102 describe a method of providing a semiconductor substrate that comprises providing a CZ crystal growth apparatus (for example, apparatus 100), which includes a crucible (for example, crucible 103), a melt of semiconductor material comprising silicon within the crucible comprising a first conductivity type (for example, melt 102); and a magnet (for example, magnet 109) proximate to the crucible configured to provide a magnetic field within the CZ crystal growth apparatus. The method includes providing a counter-doping source of a second conductivity type opposite to the conductive type (for example, counter-doping source 104) within the melt of semiconductor material. The method includes growing a CZ semiconductor ingot (for example, CZ semiconductor ingot 101) from the melt of semiconductor material and the counter-doping source in the presence of the magnetic field. The method includes, after CZ semiconductor ingot 101 is provided, separating the CZ semiconductor ingot into individual semiconductor substrates (for example, semiconductor substrates 11).

As described previously, the method can include shaping the CZ ingot prior to the separating step. In some examples, the method can include after the separating step: shaping the semiconductor substrates and etching the semiconductor substrates. However, at this point in the process of block B102, the semiconductor substrates are not polished. That is, the semiconductor substrates comprise unpolished CZ semiconductor substrates. In some examples, the semiconductor substrates comprise unpolished 200 mm diameter CZ silicon substrates. In some examples, the semiconductor substrates comprise unpolished 300 mm diameter CZ silicon substrates. In some examples, the semiconductor substrates comprise unpolished CZ silicon substrates having a diameter≥200 mm.

In accordance with the present description, block B103 of process flow B100 comprises denudation annealing the semiconductor substrates from CZ semiconductor ingot 101, wet oxidation annealing the substrates, and in some examples, removing the oxide from the substrate. The denudation annealing step can be referred to as a first annealing, and the wet oxidation annealing step can be referred to as a second annealing, or a thermal oxidation annealing. FIG. 5 illustrates a simplified cross-sectional view of an apparatus 200 for performing the denudation annealing and the wet oxidation annealing of the semiconductor substrates of block B103. In some examples, apparatus 200 is a vertical high temperature furnace configured to process one or more semiconductor substrates.

In some examples, apparatus 200 comprises a chamber 201, which can also be referred to as a furnace chamber or process chamber Chamber 201 is configured to contain semiconductor substrates 11 within a boat or substrate holder 202 and is configured to withstand high processing temperatures. In some examples, chamber 201 comprises silicon carbide. In some examples, boat 202 is configured for high temperature processing and comprises silicon carbide covered with a polysilicon structure. A heat source 203 surrounds chamber 201 and is configured to uniformly heat semiconductor substrates 11 during the denudation annealing and wet oxidation annealing steps. In some examples, heat source 203 can be a resistive heating element.

In accordance with the present description, apparatus 200 is configured to provide both the denudation annealing step and the wet oxidation annealing step so that semiconductor substrates 11 remain within apparatus 200 for both annealing steps. That is, in some examples semiconductor substrates 11 are not exposed outside of chamber 201 between the denudation annealing step and the wet oxidation annealing step. Accordingly, apparatus 200 is configured for different process gases for the denudation annealing step and the wet oxidation annealing step. In accordance with the present description, apparatus 200 can be configured for process gas 206, process gas 207, process gas 208, and process gas 209. Process gas 206 is an inert gas, preferably argon gas for the denudation annealing step of block B103. In some examples, process gas 207 is oxygen for use during process temperature ramping. Process gas 208 can be hydrogen and process gas 209 can be oxygen, which can feed a steam generator apparatus 204 for the wet oxidation annealing step of block B103. Chamber 201 can include an outlet 211 configured as a gas outlet for removing processes gases from chamber 201 during the annealing steps.

In accordance with the present description, the denudation annealing is configured to reduce or eliminate voids within semiconductor substrates 11. In some examples, the denudated annealing can include placing unpolished semiconductor substrates 11 from CZ semiconductor ingot 101 within apparatus 200 (for example, using boat 202). In accordance with the present description, the temperature within chamber 201 is ramped up or increased to a first temperature, which can be at least 1220 degrees Celsius for the first annealing or denudation annealing step. In some examples, a ramp rate between about one (1) degree Celsius and about five (5) degrees Celsius per minute is used for the temperature ramp rate up to the selected temperature for the denudation annealing.

During the ramp-up portion of the denudation annealing step, process gas 206 and process gas 207 can be turned on with process gas 206 comprising an inert gas and process gas 207 comprising oxygen with the oxygen set to about 2% of the total gas flow into chamber 201. In accordance with the present description, process gas 206 preferably comprises argon, which provides an inert environment with chamber 201 for the denudation annealing. Once the chamber stabilizes to the selected denudation annealing temperature, the oxygen is turned off. In some examples, the temperature for the denudation annealing is in a range from about 1230 degrees Celsius to about 1260 degrees Celsius. In some examples, the temperature for the denudation annealing is about 1250 degrees Celsius. The temperature for the denudation annealing is an example of a first temperature. In some examples, the denudation annealing is done for a time between about 30 minutes and about 60 minutes. The denudation annealing time is an example of a first time.

Figure 6:
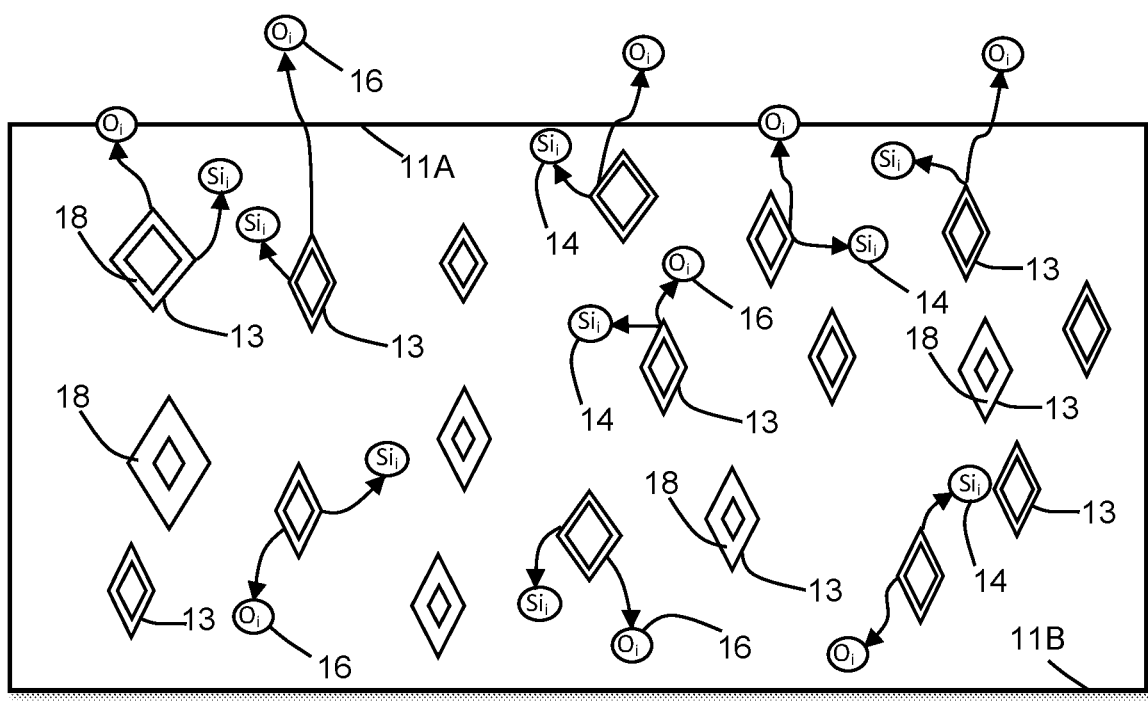
FIG. 6 illustrates a partial cross-sectional view of an example semiconductor substrate at an early step of manufacture in accordance with the present description.

FIG. 6 illustrates a cross-sectional view of semiconductor substrate 11 from CZ semiconductor ingot 101 and illustrates the material changes to voids 13 within semiconductor substrate 11 because of the denudation annealing. Semiconductor substrate 11 comprises a major surface 11A and a major surface 11B opposite to major surface 11A. In some examples, major surface 11A can be referred to as a front side or upper side of semiconductor substrate 11, and major surface 11B can be referred to as back side or lower side of semiconductor substrate 11. FIG. 6 illustrates voids 13 with inner wall oxides 18 dispersed throughout the bulk region of semiconductor substrate 11. During the denudation annealing at high temperature in the presence of argon, inner wall oxide 18 dissolves into dissolved silicon 14 (designated as interstitial silicon ($Si_i$) in FIG. 6) and dissolved oxygen 16 (designated as interstitial oxygen ($O_i$) in FIG. 6). It was found in practice that the inner wall oxide sufficiently dissolves in about one (1) hour at 1250 degrees Celsius. In some examples the dissolved oxygen can diffuse out of semiconductor substrate 11 during the denudation annealing as generally illustrated in FIG. 6. Since semiconductor substrate 11 are unpolished during this process, damage to the polished surface can be avoided.

After the denudation annealing, semiconductor substrates 11 remain within chamber 201 for the wet oxidation annealing in accordance with the present description. In some examples, the temperature for the wet oxidation annealing is in a range from about 1230 degrees Celsius to about 1260 degrees Celsius. In some examples, the temperature for the wet oxidation annealing is about 1250 degrees Celsius. The temperature for the wet oxidation annealing is an example of a second temperature. In some examples, steam generator 204 is used to provide a wet oxidation environment within chamber 201 for the wet oxidation annealing. In some examples, the wet oxidation annealing is done for a time between about one (1) hour to about three (3) hours. In some examples, the wet oxidation annealing preferably does not exceed three hours to avoid causing any interstitial defects. The wet oxidation annealing time is an example of a second time. After the wet oxidation annealing is completed, the temperature in chamber 201 can be ramped down at a rate of between about 0.7 degrees Celsius to about 3 degrees Celsius per minute before removing semiconductor substrates 11 from chamber 201 and apparatus 200.

Figure 7:
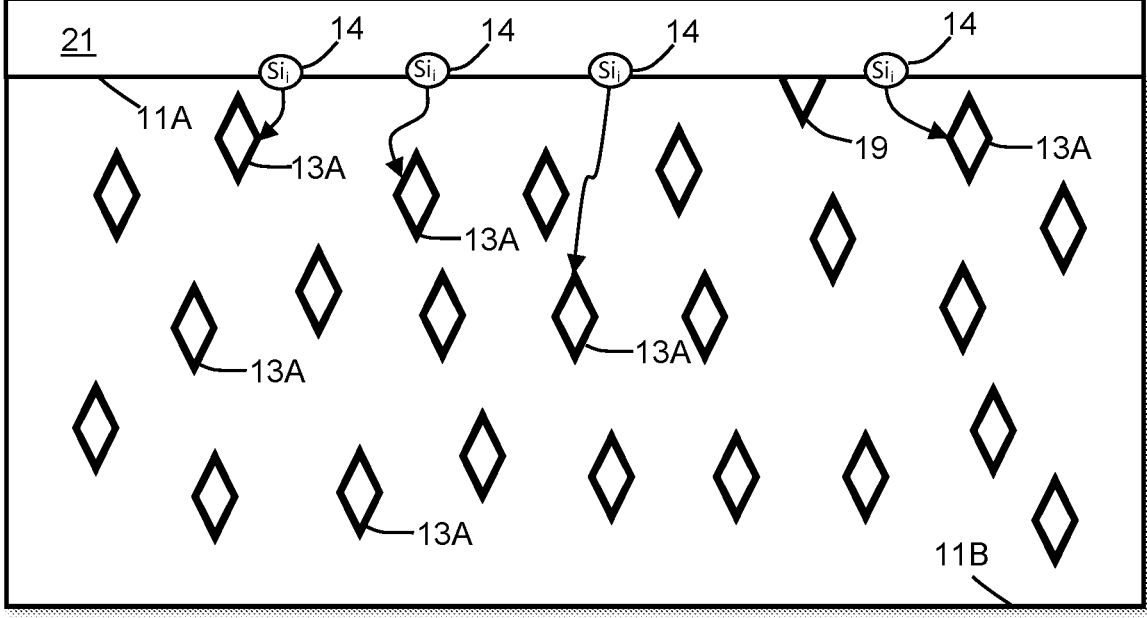
FIG. 7 is a partial cross-sectional view of the semiconductor substrate of FIG. 6 at later step of fabrication in accordance with the present description.
Figure 8:
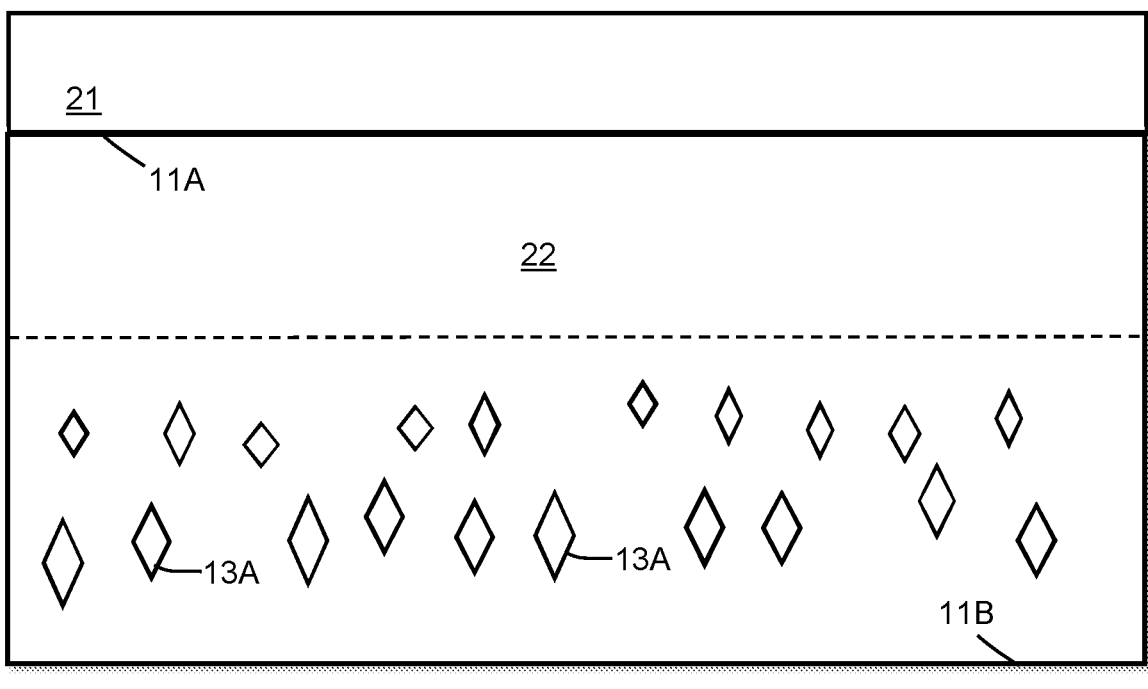
FIG. 8 is a partial cross-sectional view of the semiconductor substrate of FIG. 7 at further step of fabrication in accordance with the present description.

FIG. 7 illustrates a cross-sectional view of semiconductor substrate 11 during the wet oxidation annealing and FIG. 8 illustrates a cross-sectional view of semiconductor substrate 11 after the completion of the wet oxidation annealing in accordance with the present description. FIG. 7 also shows an example of a crystal originated particle (COP) 19 at major surface 11A, which are generally voids that may be present at the surface of semiconductor substrate as an oxide 21 grows over major surface 11A. During the growth of oxide 21, additional silicon interstitials 14 are injected into the bulk region of semiconductor substrate 11, which fill voids 13A. Voids 13A are voids 13 with inner wall oxide 18 removed during the denudation annealing. In accordance with the present description, the wet oxidation annealing creates a void free and COP free zone 22 as illustrated in FIG. 8. In some examples, oxide 21 is removed after the wet oxidation annealing using wet chemical etching or other techniques as known to one of ordinary skill in the art.

Block B104 describes polishing and then cleaning semiconductor substrates 11 after wet oxidation annealing described in block B103. In some examples, at least major surface 11A of semiconductor substrate 11 is polished using, for example, chemical-mechanical polishing. The chemical-mechanical polishing removes a portion of semiconductor substrate 11 adjacent to major surface 11A to produce a highly reflective, scratch free, and damage free surface designated as major surface 11AB. Major surface 11AB can also be referred to a front side or upper side of semiconductor substrate 11. In some examples, approximately 15 microns of material can be removed from the upper side of semiconductor substrate 11. After the polishing, semiconductor substrate 11 can be subjected to a series of chemical dips and rinses to remove polish slurry followed by a final cleaning process.

Figure 9:
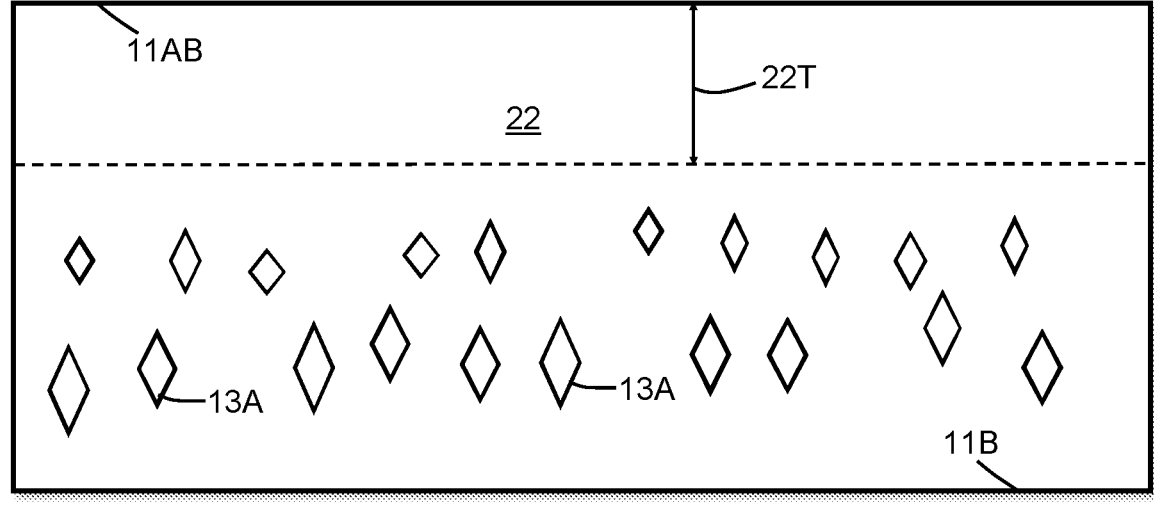
FIG. 9 is a partial cross-sectional view of the semiconductor substrate of FIG. 8 at a still further step of fabrication in accordance with the present description.

FIG. 9 illustrates semiconductor substrate 11 after the polishing and cleaning processes of block B104. In accordance with the present description, COP free zone 22 comprises a thickness 22T extending inward from major surface 11AB. It was found in practice that the method in accordance with the present description can provide a thickness 22T of up to about 100 microns. This thickness is beneficial for manufacturing certain vertical high voltage power semiconductor devices, such as insulated gate bipolar transistors (IGBTs) or metal-oxide semiconductor field effect transistors (MOSFETs) that typically use FZ semiconductor substrates.

It was found in practice that semiconductor substrate 11 processed in accordance with the method as described herein can have the following attributes. In some examples, semiconductor substrate 11 comprises a CZ silicon substrate having an N-type conductivity with a resistivity from about 1 ohm-cm to about 110 ohm-cm with a boron and phosphorous concentration B:P up to 50%. In some examples, semiconductor substrate 11 comprises an oxygen concentration below the precipitation limit, that is, below about 26 ppma, and a radial resistivity variation less than about 3.5%. In some examples, semiconductor substrate 11 comprises a COP free polished substrate with a surface concentration of COP defects less than about 1 defect/cm² for COP defects greater than 0.06 microns in size and comprises a COP free zone up to about 100 microns under the polished surface. Semiconductor substrate 11 comprises a COP free polished substrate without any vacancy rich pattern area. In addition, semiconductor substrate 11 comprises equivalent or better characteristics than a comparable FZ semiconductor substrate and can be manufactured at about 50% the cost of a FZ semiconductor substrate. Finally, semiconductor substrate 11 can be produced at larger diameters (≥200 mm), which are not currently available for FZ semiconductor substrates.

Figures 10, 11:
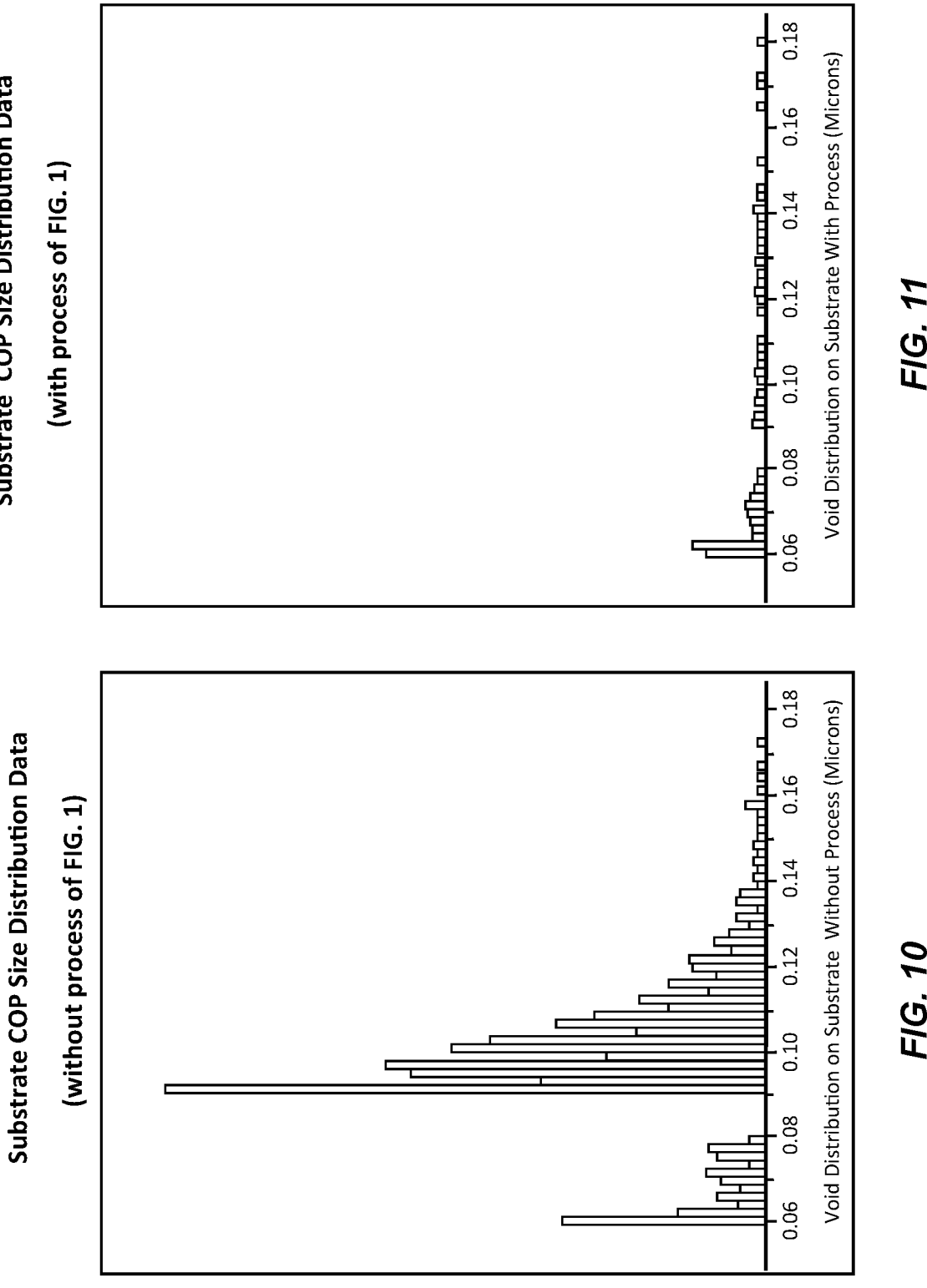
FIG. 10 graphically illustrates substrate crystal originated particle (COP) distribution data for a substrate not processed in accordance with the example method of FIG. 1.
FIG. 11 graphically illustrates substrate COP distribution data for a substrate processed in accordance with the example method of FIG. 1 in accordance with the present description.

FIGS. 10 and 11 graphically illustrate substrate crystal originated particle (COP) distribution data for a substrate not processed in accordance with process flow B100 of FIG. 1 and for a substrate processed in accordance with the process flow B100 of FIG. 1 respectively. As shown in FIG. 11, process flow B100 significantly reduces the concentration of COP defects.

Block B105 of process flow B100 describes manufacturing semiconductor devices using the substrates processed in accordance with blocks B101 to B104 of process flow B100. By way of examples, semiconductor substrates 11 manufactured using blocks B101 to B104 can be subsequently processed in accordance with conventional process techniques and process flows as known to those of ordinary skill in the art, including but not limited to, dielectrics formation, doped regions formation (patterning, doping, annealing), electrode formation, etc. In some examples, semiconductor substrate 11 can be reduced in thickness during block B105 to a thickness that is approximate to thickness 22T of COP free region 22. For example, semiconductor substrate 11 can be thinned to thickness of 100 microns or less using the Taiko® Process available from Disco Corporation of Tokyo, Japan. In other examples, semiconductor substrate 11 can be thinned using conventional techniques to a thickness that is proximate to or greater than thickness 22T of COP region 22. In some examples, semiconductor substrate 11 is used to manufacture a power semiconductor device, such as an IGBT device.

Figure 12:
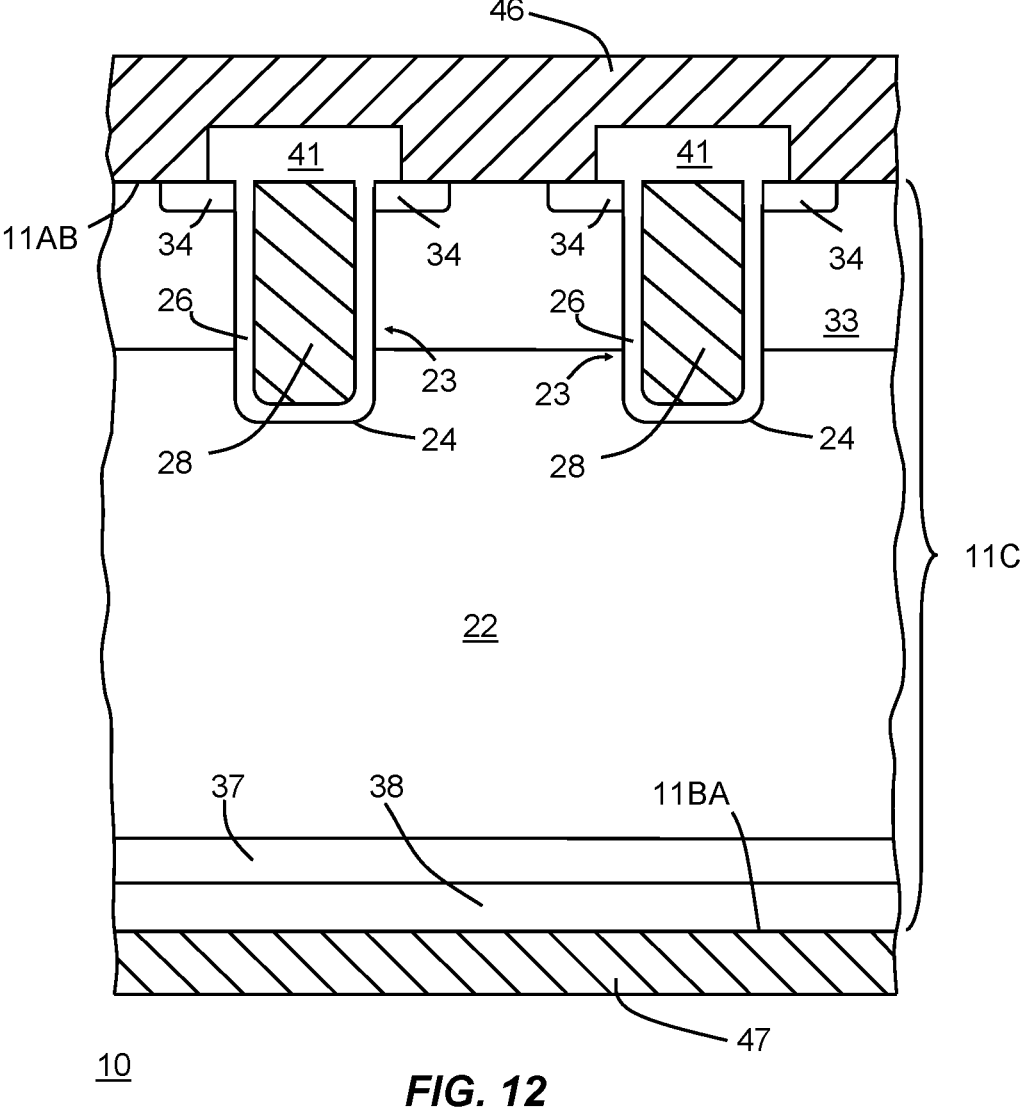
FIG. 12 illustrates a partial cross-sectional view of a semiconductor device manufactured using a substrate in accordance with the present description.

FIG. 12 illustrates a partial cross-sectional view of a semiconductor device 10 manufactured using semiconductor substrate 11 in accordance with the present description. In the present example, semiconductor device 10 comprises an IGBT, but it is understood that semiconductor device 10 can be other types of semiconductor devices, such as MOSFETs or semiconductor devices that typically use FZ semiconductor substrates. It is understood that a plurality of semiconductor devices 10 are manufactured using semiconductor 11 and then separated into individual devices.

Semiconductor device 10 comprises region of semiconductor material 11C, which is a portion of semiconductor substrate 11. Region of semiconductor material 11C comprises major surface 11AB as described previously and further comprises a major surface 11BA, which is formed by thinning the back side of semiconductor substrate from major surface 11B. In accordance with the present description, region of semiconductor material 11C includes COP free zone 22 formed using process flow B100 of FIG. 1. In some examples, region of semiconductor material 11C comprises a first conductivity type, such as N-type conductivity.

Semiconductor device 10 comprises a doped region 33 extending inward from major surface 11AB and comprises a second conductivity type opposite to the first conductivity type. In the present example, doped region 33 is P-type conductivity and can also be referred to a base region for semiconductor device 10. Semiconductor device 10 comprises gate structures 23, which each comprise, in some examples a gate trench 24 extending from major surface 11AB through doped region 33 into region 22. Gate structures 23 further comprise a gate dielectric 26 and a gate electrode 28. Doped region 34 comprising the first conductivity type are formed within doped region 33 on opposing sides of gate structures 23 and provide source regions for semiconductor device 10. Gate structures 23 are configured to control a channel region within doped region 33 extending vertically from doped region 34 to region 22.

Semiconductor device 10 further comprises a doped region 38 of the second conductivity type adjacent to major surface 11BA. Doped region 38 can be referred to as a collector region for semiconductor device 10. In some examples, semiconductor device 10 comprises a doped region 37 of the first conductivity type, which can be referred to as a field stop region for semiconductor device 10. Semiconductor device 10 can further comprise a dielectric 41 formed over or as part of gate structures 23, a conductor 46 formed over major surface 11AB, and a conductor 46 provided over major surface 11BA.

In some examples, COP free region 22 can extend from major surface 11AB to major surface 11BA when semiconductor substrate is thinned to about 100 microns or less. In accordance with the present description, semiconductor substrate 11 processed using process flow B100 of FIG. 1 provides a CZ semiconductor substrate with characteristics found previously in only FZ semiconductor substrates at a reduced substrate cost. In addition, the CZ semiconductor substrate of the present description can be manufactured at larger diameters than FZ semiconductor substrates. This provides a more cost effective semiconductor device 10.

In summary, a method and structure have been described for manufacturing a CZ semiconductor substrate includes manufacturing a CZ semiconductor ingot with magnetic CZ crystal growth and continuous counter-doping. The method includes exposing unpolished CZ semiconductor substrates from the CZ semiconductor ingot to a first annealing to dissolve inner wall oxides from voids within the CZ semiconductor substrates. The method includes a second annealing that provides silicon interstitials to form a COP free zone within the CZ semiconductor substrates. The method provides CZ semiconductor substrates with reduced oxygen concentration, improved radial resistivity variation, and reduced COP defects. In addition, the method produces CZ semiconductor ingots with reduced axial resistivity variation, which improves utilization. The CZ semiconductor substrates of the present description comprise characteristics similar to FZ semiconductor substrates at significantly lower cost (for example, 50% less in some cases).

It is understood that the different examples described herein can be combined with any of the other examples described herein to obtain different embodiments.

While the subject matter of the invention is described with specific preferred examples, the foregoing drawings and descriptions thereof depict only typical examples of the subject matter and are not therefore to be considered limiting of its scope. It is evident that many alternatives and variations will be apparent to those skilled in the art. For example, the conductivity types of the various regions can be reversed.

As the claims hereinafter reflect, inventive aspects may lie in less than all features of a single foregoing disclosed example. Thus, the hereinafter expressed claims are hereby expressly incorporated into this Description, with each claim standing on its own as a separate example of the invention. Furthermore, while some examples described herein include some, but not other features included in other examples, combinations of features of different examples are meant to be within the scope of the invention and meant to form different examples as would be understood by those skilled in the art.

What is claimed is:

1. A method of manufacturing a semiconductor device, comprising:

providing a semiconductor substrate comprising an unpolished CZ silicon substrate, a substrate upper side, and a substrate lower side opposite to the substrate upper side;

first annealing the semiconductor substrate at a first temperature in an inert environment for a first time;

second annealing the semiconductor substrate at a second temperature in a wet oxidation environment for a second time;

polishing the semiconductor substrate after the second annealing, wherein the polishing comprises removing about 15 microns of material from the substrate upper side; and before forming the semiconductor device, thinning the semiconductor substrate to a thickness of about 100 microns or less from the substrate lower side;

wherein the first annealing comprises:

using in an inert environment comprising argon;

first annealing with the first temperature being at least 1220 degrees Celsius; and first annealing with the first time between about 30 minutes to about 60 minutes; and wherein the second annealing comprises:

second annealing with the second temperature in a range from about 1230 degrees Celsius to about 1260 degrees Celsius; and second annealing with the second time between about one (1) hour and about three (3) hours.

2. The method of claim 1, wherein:

the second annealing comprises:

second annealing with the second temperature at about 1250 degrees Celsius; and second annealing with the second time no longer than three (3) hours.

3. The method of claim 1, further comprising:

providing an anneal apparatus; wherein:

the first annealing and the second annealing take place in the anneal apparatus without removing the semiconductor substrate between the first annealing and the second annealing.

4. The method of claim 1, wherein:

providing the semiconductor substrate comprises:

providing a CZ crystal growth apparatus comprising:

a crucible, a melt of semiconductor material comprising silicon within the crucible comprising a first conductivity type, and a magnet proximate to the crucible configured to provide a magnetic field within the CZ crystal growth apparatus;

providing a counter-doping source of a second conductivity type opposite to the first conductivity type within the melt of semiconductor material;

growing a CZ semiconductor ingot from the melt of semiconductor material and the counter-doping source in the magnetic field; and thereafter separating the CZ semiconductor ingot into individual substrates including the semiconductor substrate.

5. The method of claim 4 wherein:

providing the counter-doping source comprises providing a rod comprising silicon doped with a second conductivity type dopant.

6. The method of claim 5, wherein:
growing the CZ semiconductor ingot comprises continuously dipping the rod with the second conductivity type dopant into the melt of semiconductor material.
7. The method of claim 4, further comprising:
etching the semiconductor substrate after separating the CZ semiconductor ingot and before the first annealing.
8. The method of claim 1, wherein:
the second annealing provides a region proximate to the substrate upper side that comprises crystal originated particle (COP) defect surface concentration of less than 1 defect/cm² for COP defects greater than about 0.06 microns in size; and
the region has a thickness of about 100 microns.
9. The method of claim 1, further comprising:
forming a power semiconductor device within the semiconductor substrate after thinning the semiconductor substrate.
10. The method of claim 1, wherein:
providing the semiconductor substrate comprises a providing the semiconductor substrate having diameter greater than or equal to 200 millimeters.
11. A method of forming a semiconductor device, comprising:
providing a semiconductor substrate comprising an unpolished CZ silicon substrate, a substrate upper side, and a substrate lower side opposite to the substrate upper side;
first annealing the semiconductor substrate at a first temperature in an inert environment for a first time;
second annealing the semiconductor substrate at a second temperature in a wet oxidation environment for a second time;
polishing the semiconductor substrate after the second annealing to remove about 15 microns of material from the substrate upper side;
thinning the semiconductor substrate to a thickness of about 100 microns or less from the substrate lower side, and
forming the semiconductor device within the semiconductor substrate after thinning the semiconductor substrate,
wherein the first annealing comprises:
using in an inert environment comprising argon;
first annealing with the first temperature being at least 1220 degrees Celsius; and
first annealing with the first time between 30 minutes to 60 minutes, and

wherein the second annealing comprises:
second annealing with the second temperature in a range from 1230 degrees Celsius to 1260 degrees Celsius; and
second annealing with the second time between one (1) hour and three (3) hours.
12. The method of claim 11, further comprising:
providing an anneal apparatus; wherein:
the first annealing and the second annealing take place in the anneal apparatus without removing the semiconductor substrate between the first annealing and the second annealing.
13. The method of claim 11, wherein:
providing the semiconductor substrate comprises:
providing a CZ crystal growth apparatus comprising:
a crucible,
a melt of semiconductor material comprising silicon within the crucible comprising a first conductivity type, and
a magnet proximate to the crucible configured to provide a magnetic field within the CZ crystal growth apparatus;
providing a counter-doping source of a second conductivity type opposite to the first conductivity type within the melt of semiconductor material;
growing a CZ semiconductor ingot from the melt of semiconductor material and the counter-doping source in the presence of the magnetic field; and
thereafter separating the CZ semiconductor ingot into individual substrates including the semiconductor substrate.
14. The method of claim 13, wherein:
providing the counter-doping source comprises providing a rod comprising silicon doped with a second conductivity type dopant.
15. The method of claim 14, wherein:
growing the CZ semiconductor ingot comprises continuously dipping the rod with the second conductivity type dopant into the melt of semiconductor material.
16. The method of claim 13, further comprising:
etching the semiconductor substrate after separating the CZ semiconductor ingot and before the first annealing.
17. The method of claim 11, wherein the unpolished CZ silicon substrate comprises:
an oxygen concentration less than 26 parts per million atoms (ppma); and
a radial resistivity variation less than 3.5%.
18. The method of claim 11, wherein:
forming the semiconductor device comprises forming a power semiconductor device.

*    *    *    *    *